(12) United States Patent
Daubenspeck et al.

(10) Patent No.: US 7,859,122 B2
(45) Date of Patent: Dec. 28, 2010

(54) FINAL VIA STRUCTURES FOR BOND PAD-SOLDER BALL INTERCONNECTIONS

(75) Inventors: Timothy Harrison Daubenspeck, Colchester, VT (US); Jeffrey Peter Gambino, Westford, VT (US); Christopher David Muzzy, Burlington, VT (US); David L. Questad, Hopewell Junction, NY (US); Wolfgang Sauter, Richmond, VT (US)

(73) Assignee: International Business Machines Corporation, Armonk, NY (US)

( * ) Notice: Subject to any disclaimer, the term of this patent is extended or adjusted under 35 U.S.C. 154(b) by 276 days.

(21) Appl. No.: 12/102,035

(22) Filed: Apr. 14, 2008

(65) Prior Publication Data
US 2009/0256257 A1    Oct. 15, 2009

(51) Int. Cl.
*H01L 23/48* (2006.01)
(52) U.S. Cl. .............. 257/781; 257/780; 257/784; 257/774; 257/750; 257/758; 257/738; 257/E23.011; 257/E23.015; 257/E23.019; 257/E23.02; 438/614
(58) Field of Classification Search ............. 257/750, 257/758, 738, 773–776, 779–781, 784, E23.011, 257/E23.015, E23.019, E23.02; 438/612–617
See application file for complete search history.

(56) References Cited

U.S. PATENT DOCUMENTS

| | | | | |
|---|---|---|---|---|
| 4,290,079 | A | * 9/1981 | Carpenter et al. | 257/780 |
| 5,838,023 | A | * 11/1998 | Goel et al. | 257/48 |
| 6,521,996 | B1 | * 2/2003 | Seshan | 257/737 |
| 6,709,964 | B2 | 3/2004 | Lee | |
| 7,267,883 | B2 | 9/2007 | Fujihara et al. | |
| 2007/0210425 | A1 | 9/2007 | Ramakrishna et al. | |

FOREIGN PATENT DOCUMENTS

JP    3-242938    * 10/1991 ............ 257/737

* cited by examiner

*Primary Examiner*—Jasmine J Clark
(74) *Attorney, Agent, or Firm*—Schmeiser, Olsen & Watts; Richard M. Kotulak

(57) ABSTRACT

A structure and a method for forming the same. The structure includes a first dielectric layer, an electrically conductive bond pad on the first dielectric layer, and a second dielectric layer on top of the first dielectric layer and the electrically conductive bond pad. The electrically conductive bond pad is sandwiched between the first and second dielectric layers. The second dielectric layer includes N separate final via openings such that a top surface of the electrically conductive bond pad is exposed to a surrounding ambient through each final via opening of the N separate final via openings. N is a positive integer greater than 1.

14 Claims, 11 Drawing Sheets

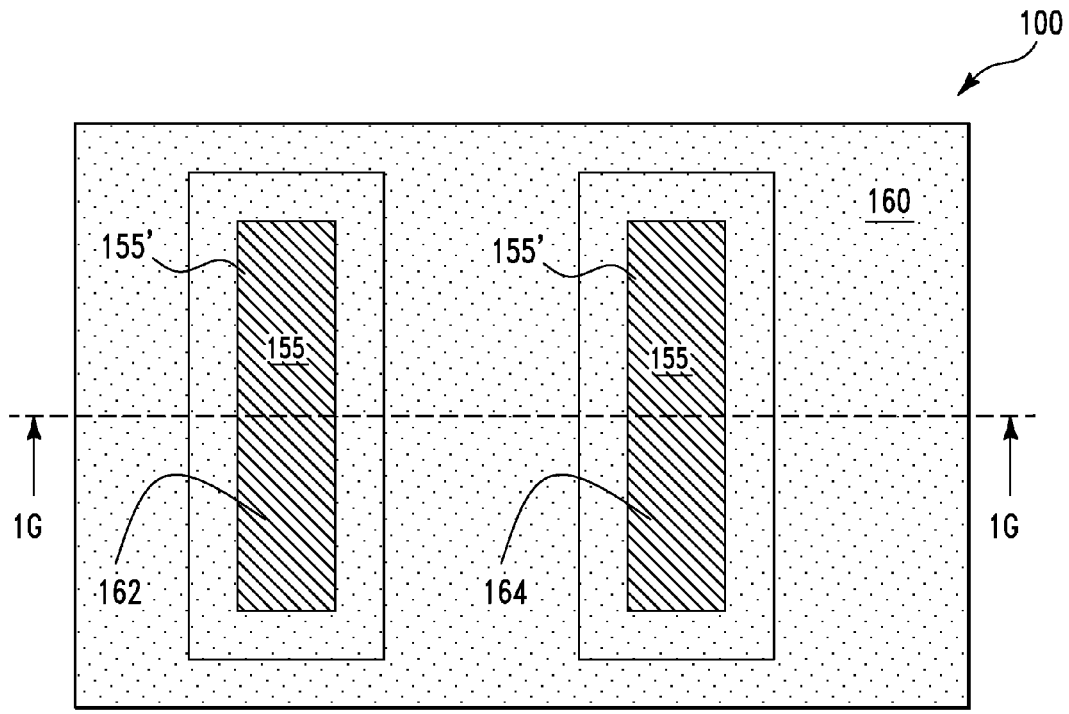
FIG. 1Gii
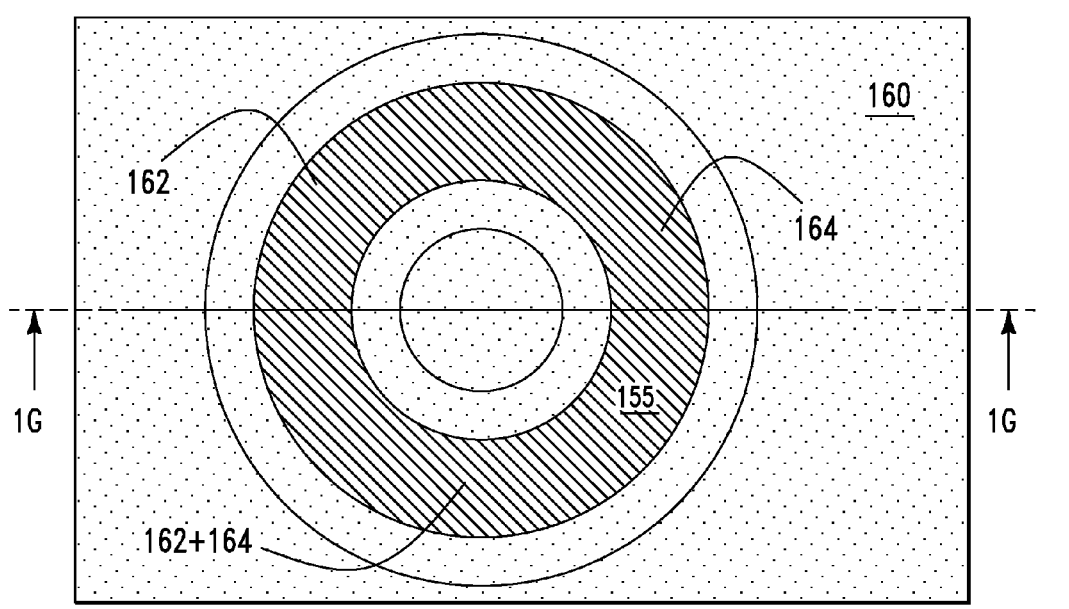
FIG. 1Giii

FINAL VIA STRUCTURES FOR BOND PAD-SOLDER BALL INTERCONNECTIONS

FIELD OF THE INVENTION

The present invention relates generally to solder balls and more particularly to final via structures for bond pad-solder ball interconnections in semiconductor integrated circuits.

BACKGROUND OF THE INVENTION

In flip chip technology, stress to regions under the bond pads during chip-join results in delamination or breakage of underlying interconnect layers. Therefore, there is a need for a final via structure (and a method for forming the same) that creates stress to the region under the bond pad lower than that in the prior art.

SUMMARY OF THE INVENTION

The present invention provides a structure, comprising a first dielectric layer; an electrically conductive bond pad on the first dielectric layer; and a second dielectric layer on top of the first dielectric layer and the electrically conductive bond pad, wherein the electrically conductive bond pad is sandwiched between the first and second dielectric layers, wherein the second dielectric layer comprises N separate final via openings such that a top surface of the electrically conductive bond pad is exposed to a surrounding ambient through each final via opening of the N separate final via openings, and wherein N is a positive integer greater than 1.

The present invention provides a final via structure (and a method for forming the same) that creates stress to the regions under the bond pad lower than that in the prior art.

BRIEF DESCRIPTION OF THE DRAWINGS

FIG. 1Gi shows a top-down view of the structure of FIG. 1G, in accordance with embodiments of the present invention.

FIG. 1Gii shows a top-down view of the structure of FIG. 1G, in accordance with an alternative embodiment of the present invention.

FIG. 1Giii shows a top-down view of the structure of FIG. 1G, in accordance with an alternative embodiment of the present invention.

FIG. 2Bi shows a top-down view of the structure of FIG. 2B, in accordance with embodiments of the present invention.

DETAILED DESCRIPTION OF THE INVENTION

Figure 1A:
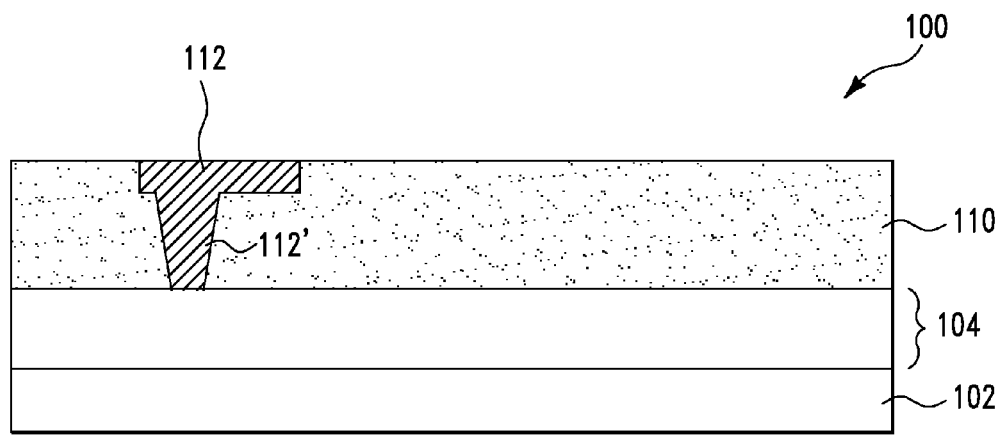
FIG. 1A shows a cross-section view of a semiconductor structure for illustrating a fabrication process, in accordance with embodiments of the present invention.
Figure 1B:
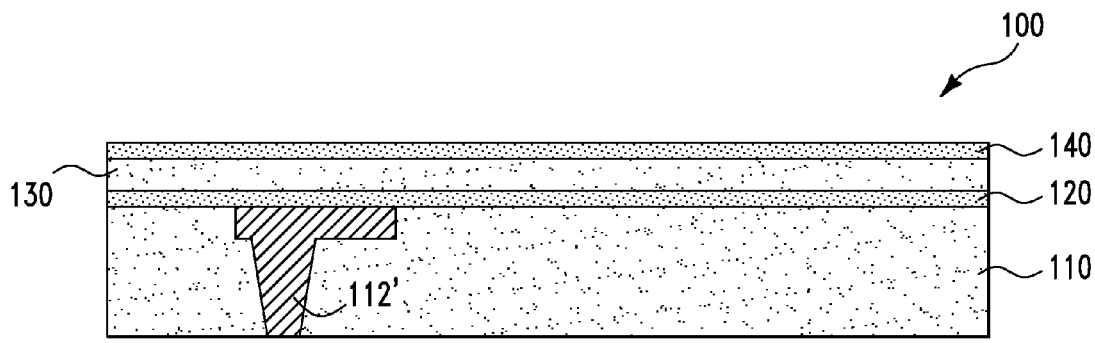
FIG. 1B shows a cross-section view of a semiconductor structure resulting from forming three dielectric layers on the structure of FIG. 1A, in accordance with embodiments of the present invention.
Figure 1C:
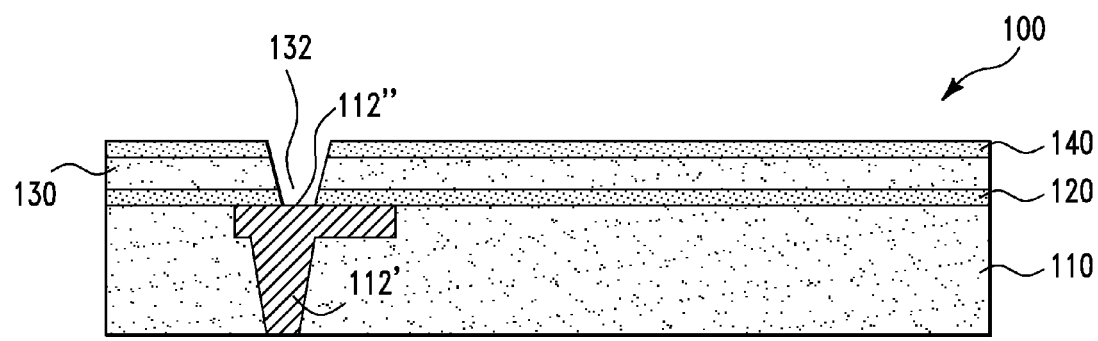
FIG. 1C shows a cross-section view of a semiconductor structure resulting from forming a terminal via hole in the three dielectric layers of the structure of FIG. 1B, in accordance with embodiments of the present invention.
Figure 1D:
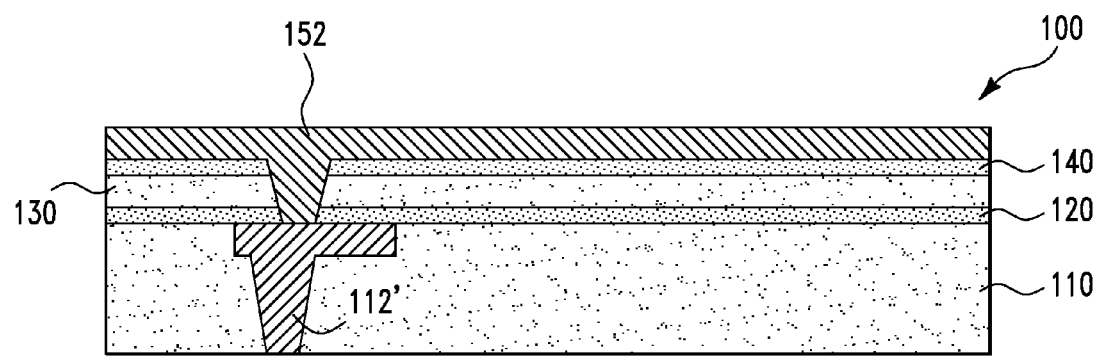
FIG. 1D shows a cross-section view of a semiconductor structure resulting from forming an aluminum layer on the structure of FIG. 1C, in accordance with embodiments of the present invention.
Figure 1E:
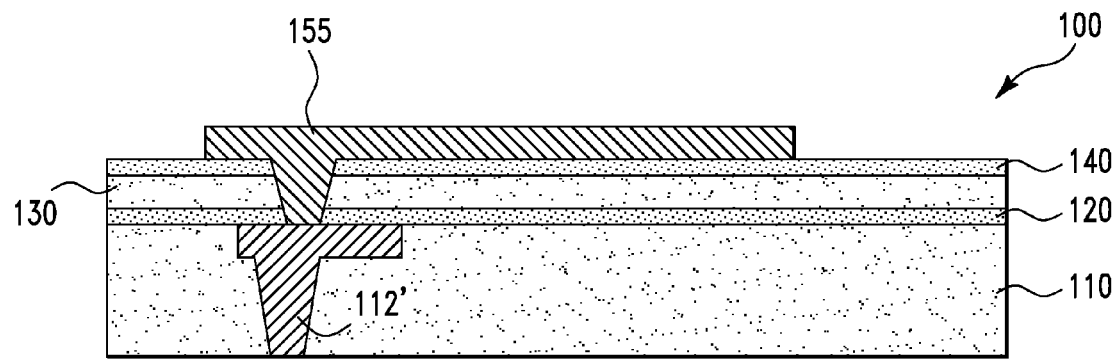
FIG. 1E shows a cross-section view of a semiconductor structure resulting from patterning the aluminum layer of the structure of FIG. 1D, in accordance with embodiments of the present invention.
Figure 1F:
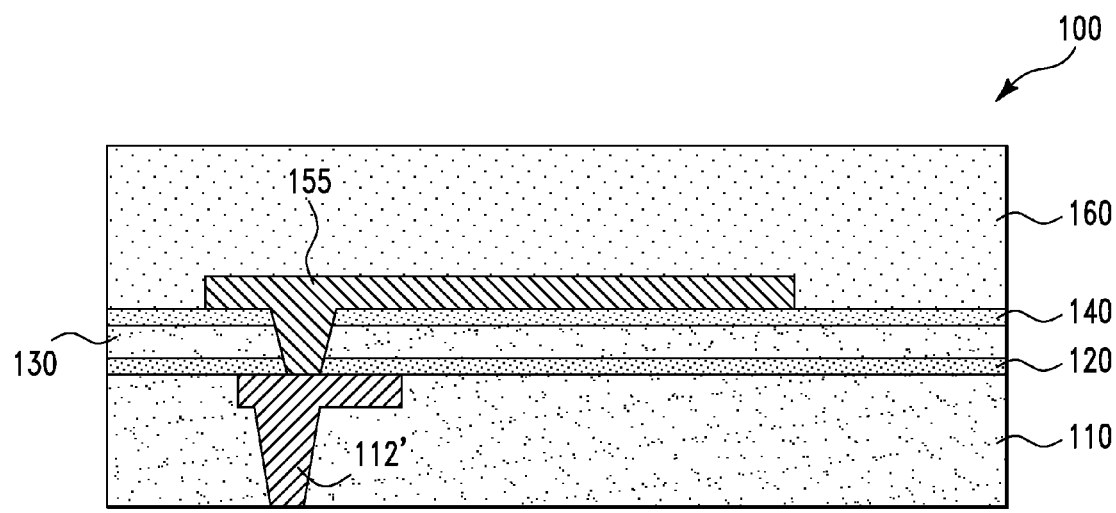
FIG. 1F shows a cross-section view of a semiconductor structure resulting from forming a polyimide layer on the structure of FIG. 1E, in accordance with embodiments of the present invention.
Figure 1G:
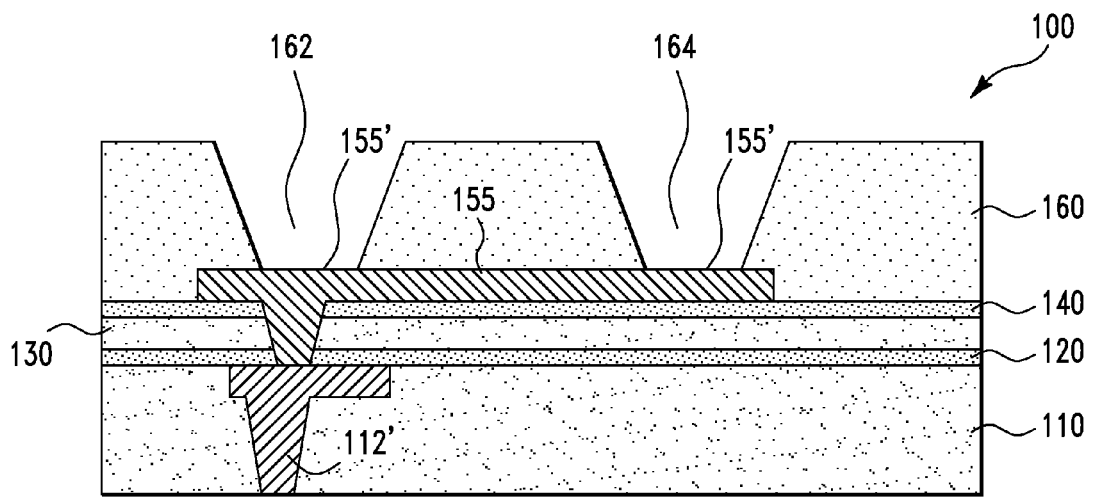
FIG. 1G shows a cross-section view of a semiconductor structure resulting from forming final via openings in the polyimide layer of the structure of FIG. 1F, in accordance with embodiments of the present invention.
Figure 1G:
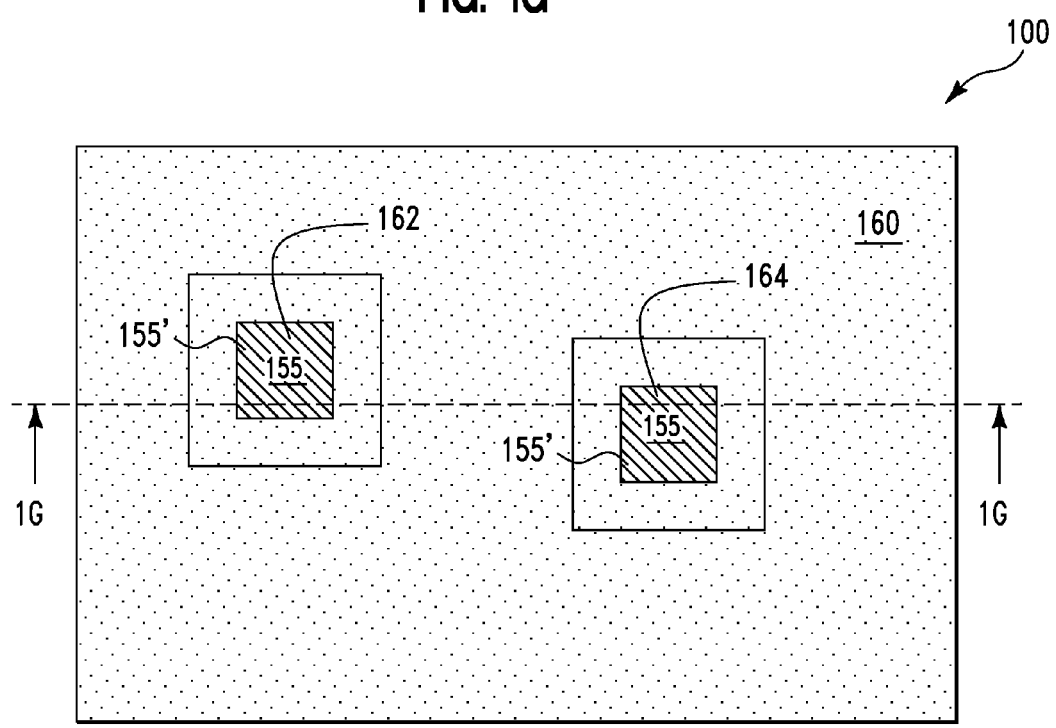
Figure 1H:
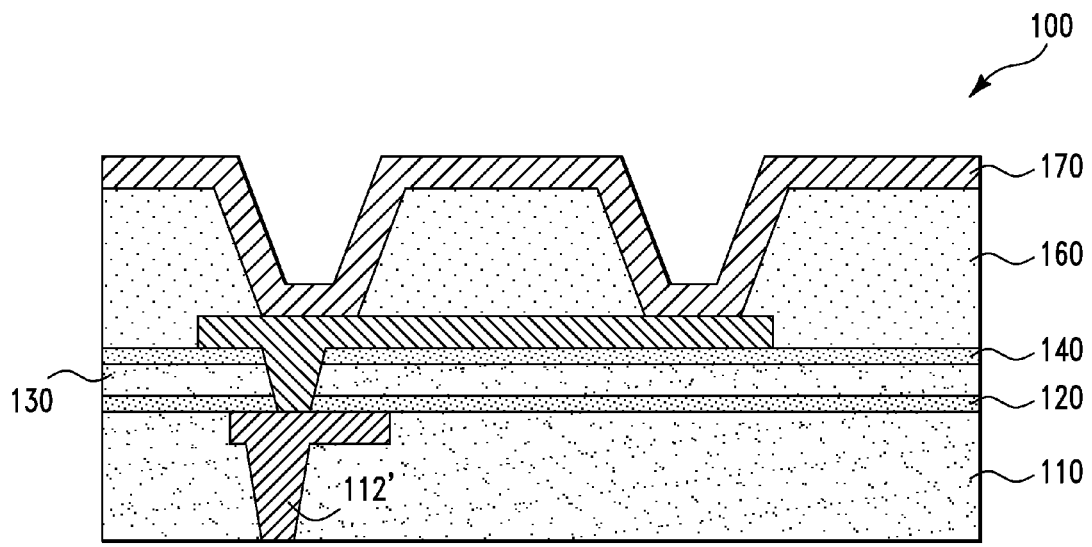
FIG. 1H shows a cross-section view of a semiconductor structure resulting from forming a ball-limiting-metallurgy (BLM) layer on the structure of FIG. 1G, in accordance with embodiments of the present invention.
Figure 1I:
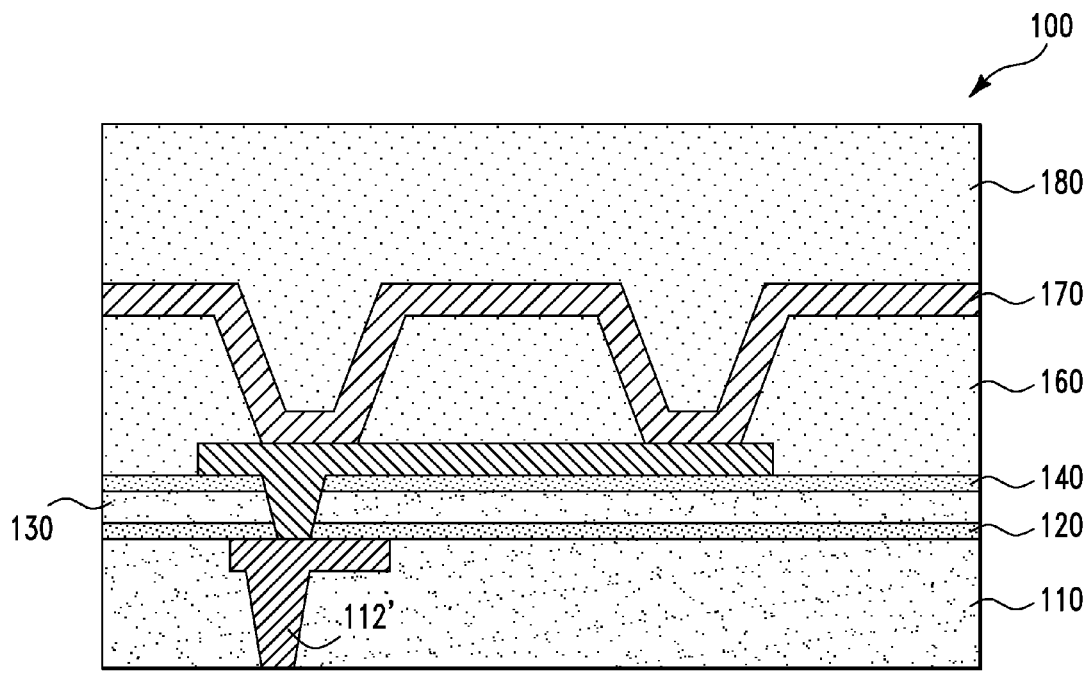
FIG. 1I shows a cross-section view of a semiconductor structure resulting from forming a photoresist layer on the structure of FIG. 1H, in accordance with embodiments of the present invention.
Figure 1J:
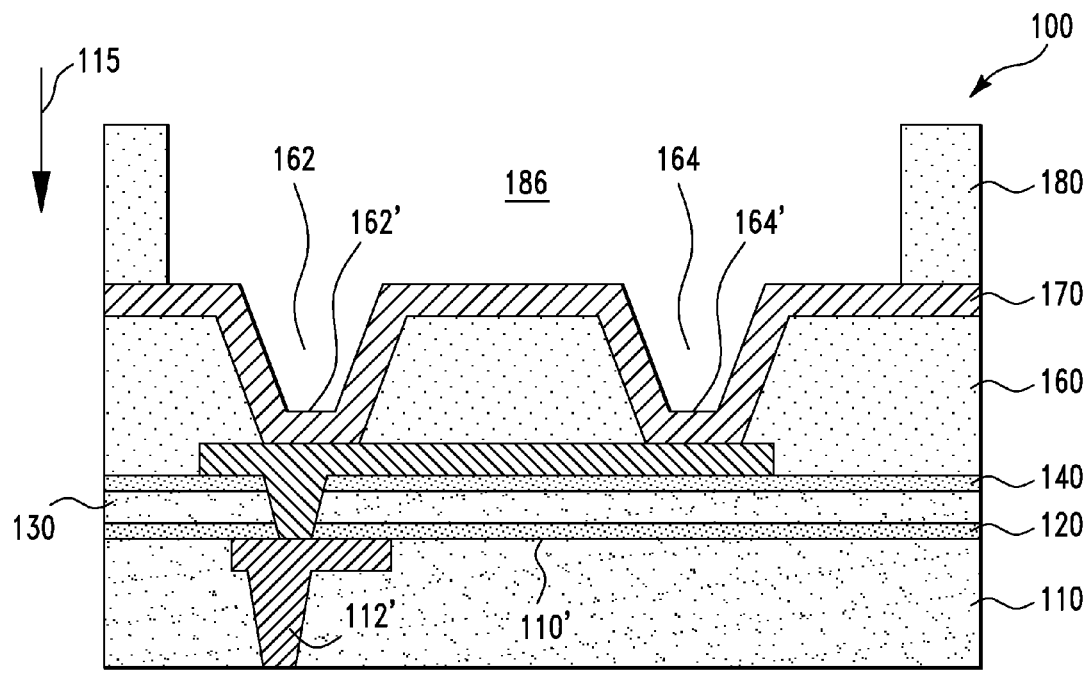
FIG. 1J shows a cross-section view of a semiconductor structure resulting from forming a hole in the photoresist layer of the structure of FIG. 1I, in accordance with embodiments of the present invention.
Figure 1K:
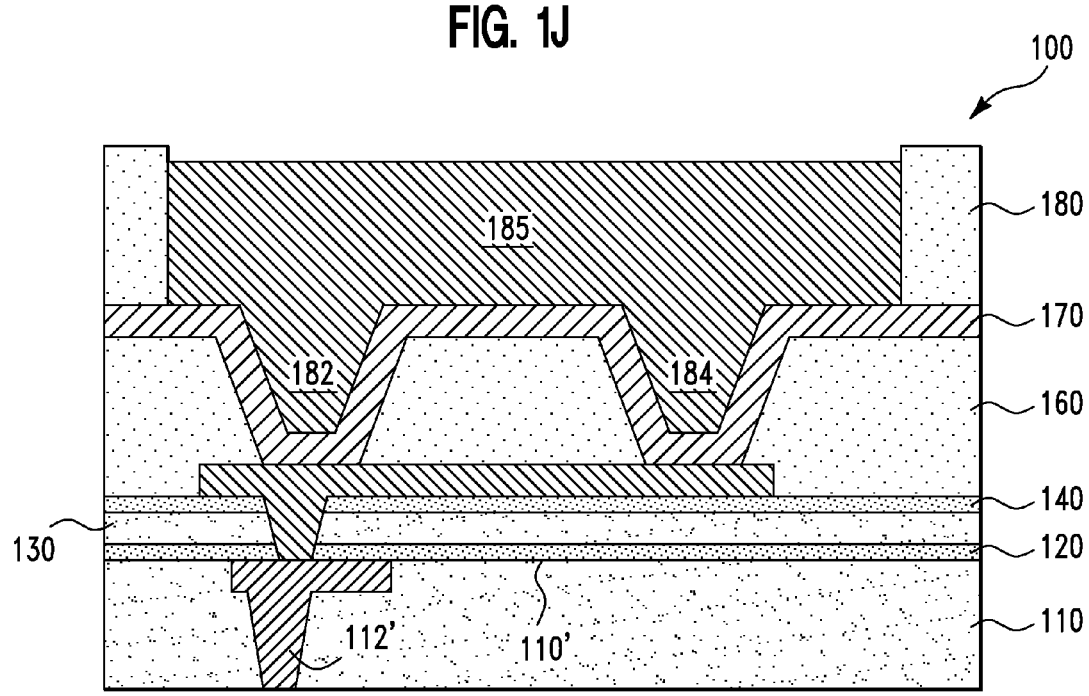
FIG. 1K shows a cross-section view of a semiconductor structure resulting from forming a solder ball region in the hole of the structure of FIG. 1J, in accordance with embodiments of the present invention.
Figure 1L:
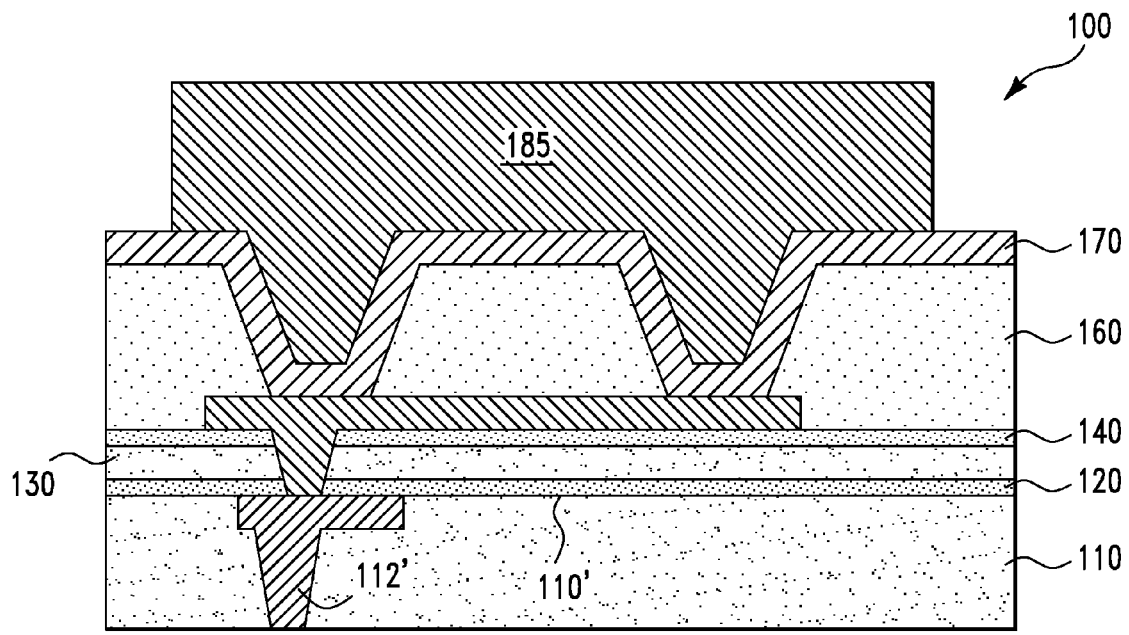
FIG. 1L shows a cross-section view of a semiconductor structure resulting from removing the photoresist layer of the structure of FIG. 1K, in accordance with embodiments of the present invention.
Figure 1M:
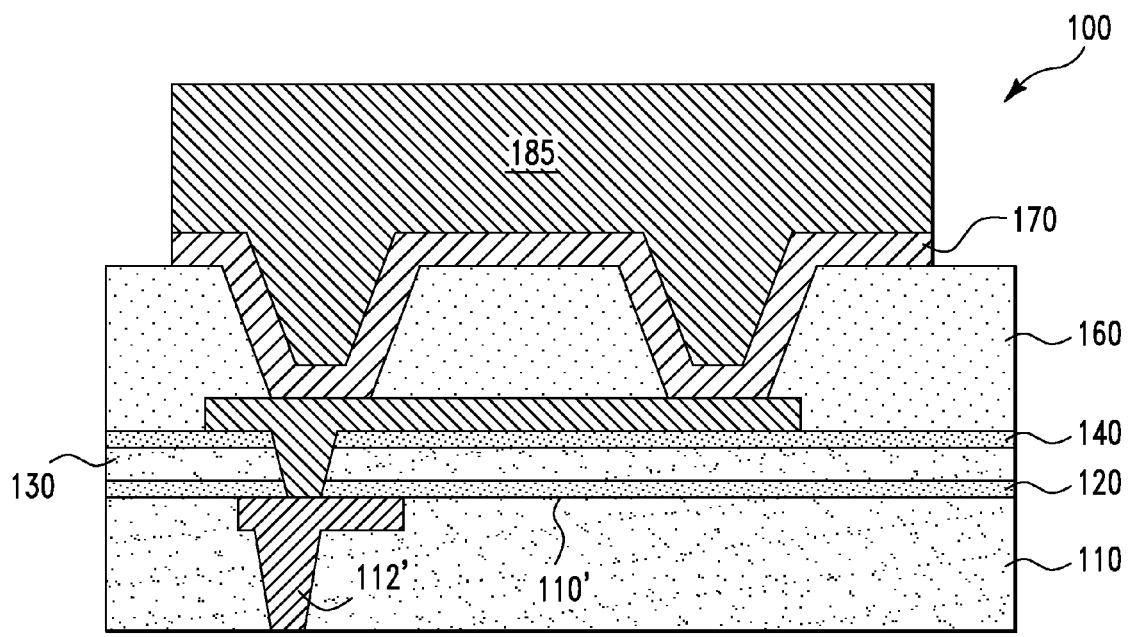
FIG. 1M shows a cross-section view of a semiconductor structure resulting from patterning the BLM layer of the structure of FIG. 1L, in accordance with embodiments of the present invention.
Figure 1N:
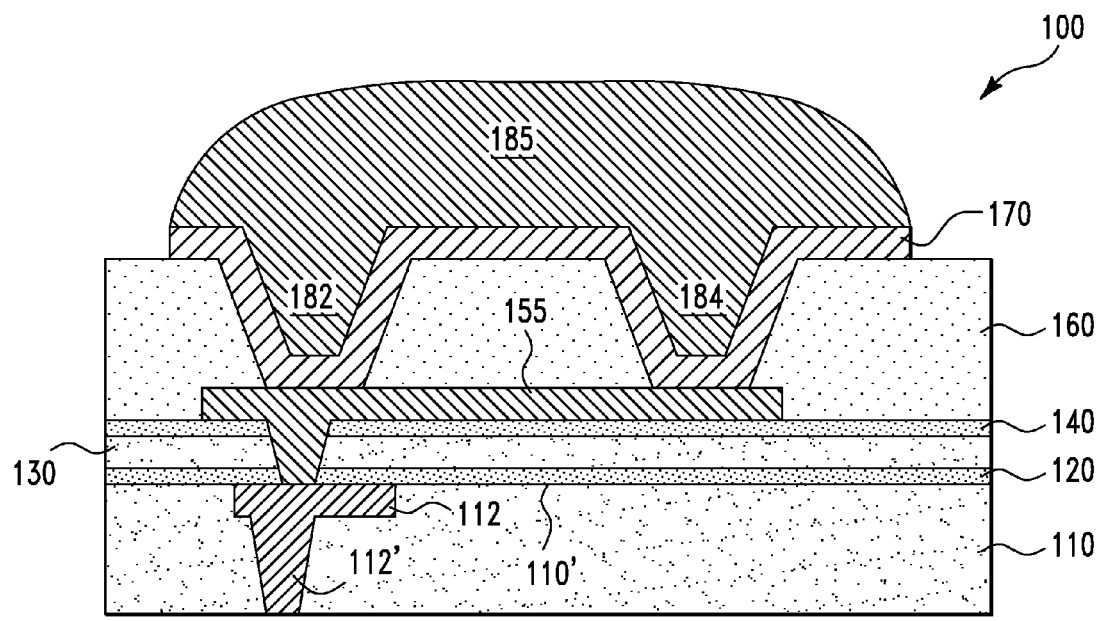
FIG. 1N shows a cross-section view of a semiconductor structure resulting from heating and reshaping the solder ball region of the structure of FIG. 1M, in accordance with embodiments of the present invention.

FIGS. 1A-1N illustrate a fabrication process of a semiconductor structure 100, in accordance with embodiments of the present invention. More specifically, with reference to FIG. 1A (cross-section view), the fabrication process of the semiconductor structure 100 can start with a semiconductor integrated circuit 102 and interconnect layers 104 on top of the semiconductor integrated circuit 102. Next, an inter-level dielectric (ILD) layer 110 can be formed on top of the interconnect layers 104. The ILD layer 110 can comprise a dielectric material such as silicon dioxide. The ILD layer 110 can be formed by a conventional method.

Next, in one embodiment, a metal line 112 and a via 112' are formed in the ILD layer 110. The metal line 112 is an electrically conductive line. The via 112' provides electrical connections from the metal line 112 to devices such as transistors, capacitors, and resistors (not shown) of the semiconductor integrated circuit 102 through the interconnect layers 104. The metal line 112 and the via 112' can comprise an electrically conductive material such as copper. The metal line 112 and the via 112' can be formed by a conventional dual damascene process. It should be noted that, in the following figures, the interconnect layers 104 and the integrated circuit 102 are not shown for simplicity.

Next, with reference to FIG. 1B, in one embodiment, a passivation layer 120+130+140 is formed on top of the structure 100 of FIG. 1A. The passivation layer comprises dielectric layers 120, 130, and 140. The dielectric layers 120 and 140 can comprise silicon nitride. The dielectric layer 130 can comprise silicon dioxide. The dielectric layers 120, 130, and 140 can be formed in turn by conventional CVD (Chemical Vapor Deposition) processes.

Next, with reference to FIG. 1C, in one embodiment, a terminal via hole 132 is formed in the passivation layer 120+130+140 such that the top surface 112" of the metal line 112 is exposed to the surrounding ambient through the terminal via hole 132. The terminal via hole 132 can be formed by lithographic and etching processes.

Next, with reference to FIG. 1D, in one embodiment, an electrically conductive layer 152 is formed on top of the structure 100 of FIG. 1C such that the terminal via hole 132 is filled with the electrically conductive layer 152. The electrically conductive layer 152 can comprise an electrically conductive material such as aluminum. The electrically conductive layer 152 can be formed by PVD (Physical Vapor Deposition).

Next, in one embodiment, the electrically conductive layer 152 is patterned resulting in an electrically conductive bond pad 155 of FIG. 1E. The electrically conductive layer 152 can be patterned by lithographic and etching processes.

Next, with reference to FIG. 1F, in one embodiment, a passivation layer 160 is formed on top of the structure 100 of FIG. 1E. The passivation layer 160 can comprise polyimide or photosensitive polyimide (PSPI). In general, the passivation layer 160 is a dielectric layer that can comprise a soft, stress-absorbing, dielectric material. If polyimide is used, the passivation layer 160 can be formed by a conventional spin-on process.

Next, with reference to FIG. 1G, in one embodiment, final via openings 162 and 164 are formed in the passivation layer 160 such that the top surface 155' of the bond pad 155 is exposed to the surrounding ambient through the final via openings 162 and 164. The final via openings 162 and 164 can be holes or trenches. If the passivation layer 160 comprises polyimide, then the final via openings 162 and 164 can be formed by a conventional lithographic process.

FIG. 1Gi shows a top-down view of the semiconductor structure 100 of FIG. 1G, in accordance with embodiments of the present invention. With reference to FIGS. 1G and 1Gi, it should be noted that FIG. 1G shows a cross-section view of the semiconductor structure 100 of FIG. 1Gi along a line 1G-1G of FIG. 1Gi. The final via openings 162 and 164 of FIG. 1Gi can also be referred to as the via holes 162 and 164.

FIG. 1Gii shows a top-down view of the semiconductor structure 100 of FIG. 1G, in accordance with an alternative embodiment of the present invention. With reference to FIGS. 1G and 1Gii, it should be noted that FIG. 1G shows a cross-section view of the semiconductor structure 100 of FIG. 1Gii along the line 1G-1G of FIG. 1Gii. The final via openings 162 and 164 of FIG. 1Gii can also be referred to as the via trenches 162 and 164.

FIG. 1Giii shows a top-down view of the semiconductor structure 100 of FIG. 1G, in accordance with an alternative embodiment of the present invention. With reference to FIGS. 1G and 1Giii, it should be noted that FIG. 1G shows a cross-section view of the semiconductor structure 100 of FIG. 1Giii along the line 1G-1G of FIG. 1Giii. It should be noted that the two final via openings 162 and 164 of FIG. 1G form a single annular via trench 162+164 as shown in FIG. 1Giii. In other words, the annular via trench 162+164 of FIG. 1Giii is considered one via opening.

Next, with reference to FIG. 1H, a ball-limiting-metallurgy (BLM) layer 170 is formed on top of the structure 100 of FIG. 1G. The BLM layer 170 can comprise three layers: a titanium-tungsten (TiW) alloy layer (not shown), a copper layer (not shown) on top of the TiW alloy layer, and a nikel layer (not shown) on top of the copper layer. The BLM layer 170 can be formed by conventional PVD processes.

Next, with reference to FIG. 1I, in one embodiment, a photoresist layer 180 is formed on top of the BLM layer 170. The photoresist layer 180 can be formed by a conventional spin-on process.

Next, in one embodiment, the photoresist layer 180 is patterned resulting in a hole 186 in the photoresist layer 180 (FIG. 1J) such that the final via openings 162 and 164 align with the hole 186 in a direction defined by an arrow 115 (hereafter can be referred to as the direction 115). In other words, each of the final via openings 162 and 164 entirely overlaps the hole 186 in the direction 115. The direction 115 is perpendicular to the top surface 110' of the ILD layer 110 and points from the photoresist layer 180 to the ILD layer 110. It is said that a first region entirely overlaps a second region in a reference direction if, for any point of the first region, a straight line going through that point and being parallel to the reference direction would intersect the second region. In one embodiment, the photoresist layer 180 is patterned by a conventional lithographic process.

Next, with reference to FIG. 1K, in one embodiment, the hole 186 and the final via openings 162 and 164 are filled with an electrically conductive material resulting in an electrically conductive region 185 and final vias 182 and 184. The electrically conductive material used to fill the hole 186 and the final via openings 162 and 164 can comprise a mixture of tin and lead or a lead-free mixture of different metals. The hole 186 and the final via openings 162 and 164 can be filled with the electrically conductive material by electroplating.

Next, with reference to FIG. 1K, in one embodiment, the photoresist layer 180 is removed resulting in the structure 100 of FIG. 1L. The photoresist layer 180 can be removed by a wet etching process.

Next, with reference to FIG. 1L, in one embodiment, the BLM layer 170 is patterned resulting in the BLM region 170 of FIG. 1M. The BLM layer 170 can be patterned by a $H_2O_2$-based wet etch or dry etch process followed by electroetching using the electrically conductive region 185 as a blocking mask.

Next, with reference to FIG. 1M, the electrically conductive region 185 is heated and reshaped by a reflow process resulting in the solder ball 185 on the BLM region 170, as shown in FIG. 1N. With reference to FIG. 1N, the solder ball 185 is electrically connected to the metal line 112 through the final vias 182 and 184, the BLM region 170, and the bond pad 155. It should be noted that the structure 100 of FIG. 1N (especially the solder ball 185) is drawn not to scale. In one embodiment, the solder ball 185 is of much larger size and extending upwards much farther than shown in FIG. 1N.

Figure 2A:
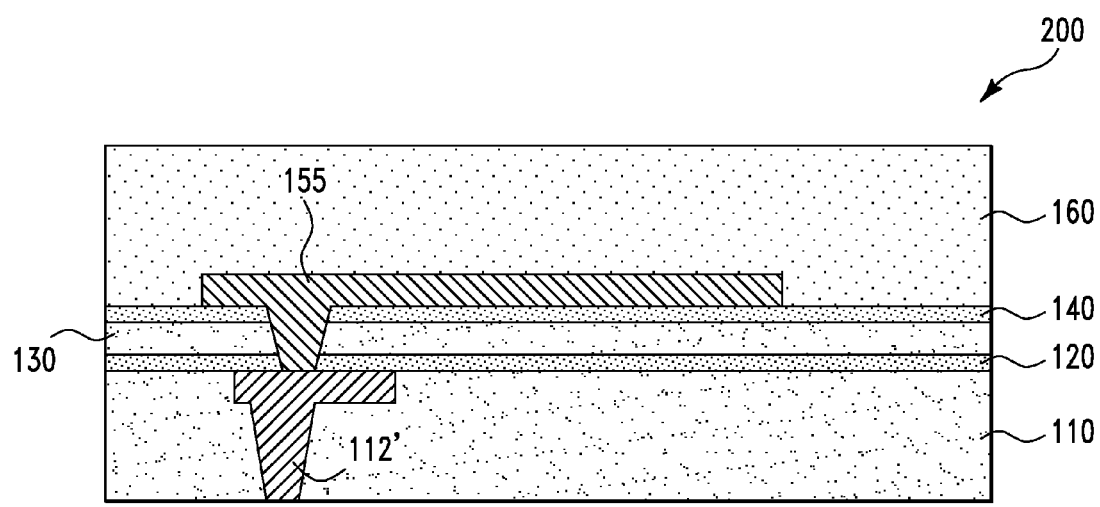
FIG. 2A shows a cross-section view of another semiconductor structure for illustrating a fabrication process, in accordance with embodiments of the present invention.
Figure 2B:
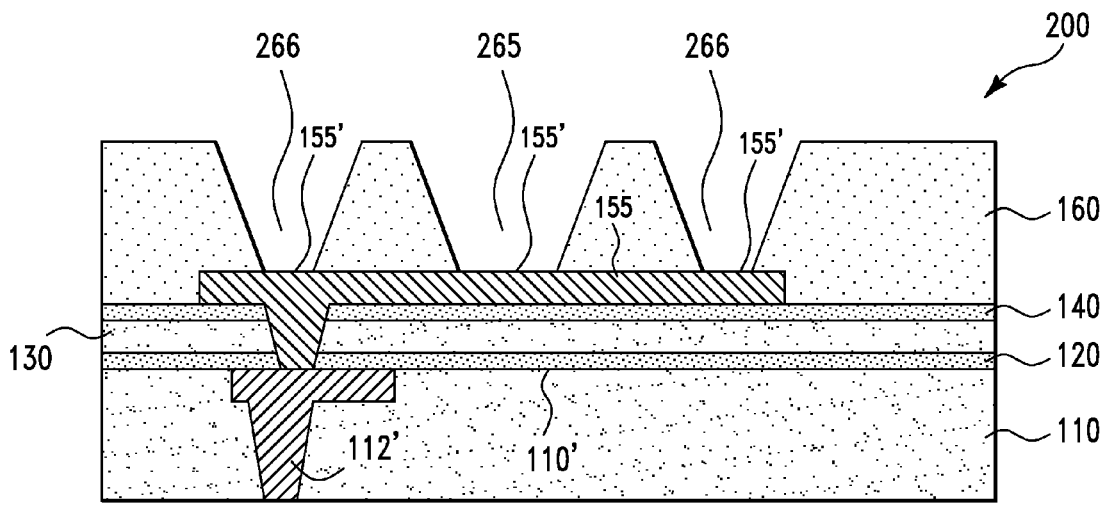
FIG. 2B shows a cross-section view of a semiconductor structure resulting from forming final via openings in a polyimide layer of the structure of FIG. 2A, in accordance with embodiments of the present invention.
Figure 2B:
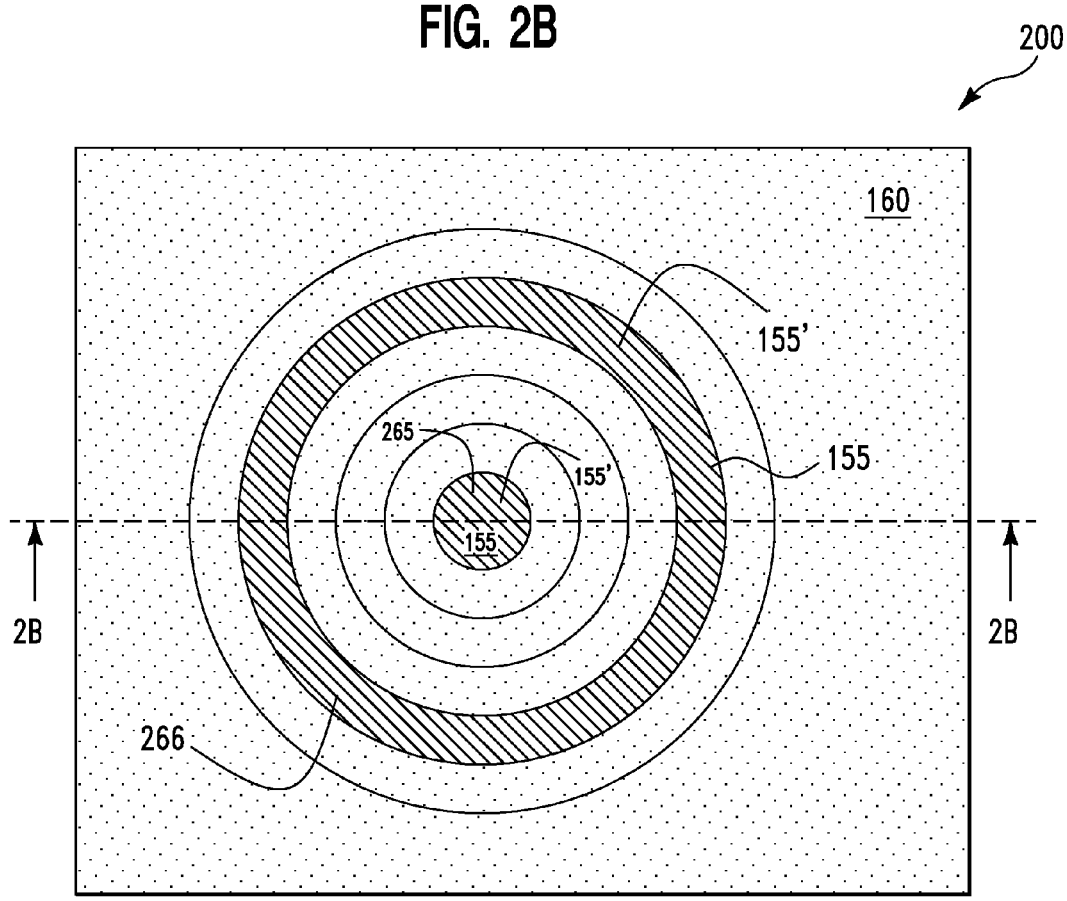
Figure 2C:
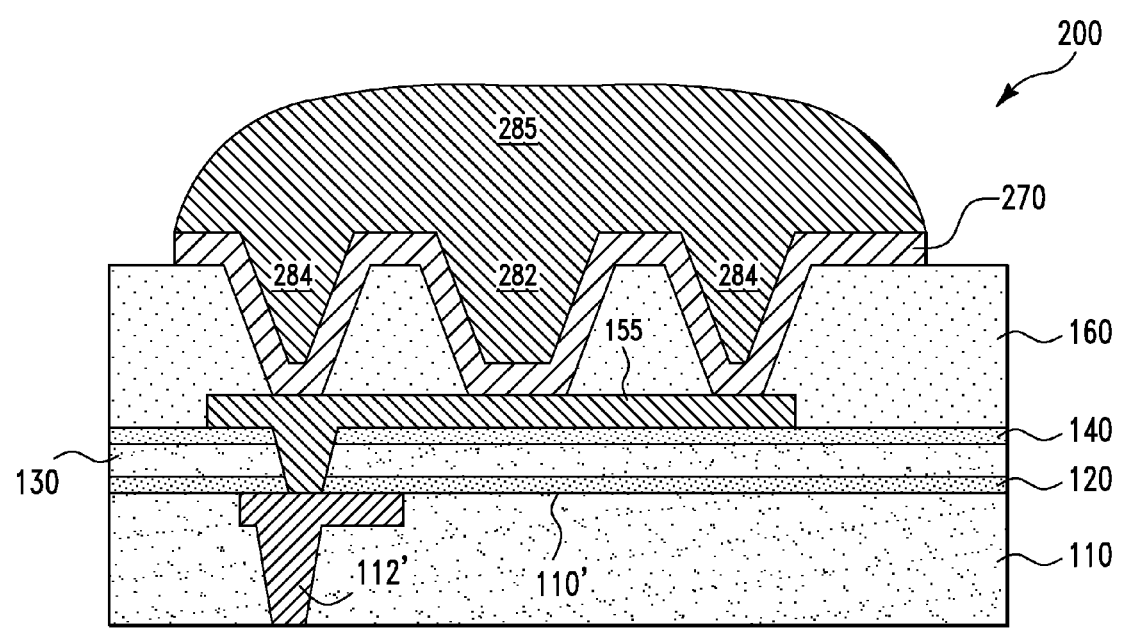
FIG. 2C shows a cross-section view of a semiconductor structure resulting from forming a BLM region and a solder ball on the structure of FIG. 2B, in accordance with embodiments of the present invention.

FIGS. 2A-2C illustrate a fabrication process of a structure 200, in accordance with embodiments of the present invention. More specifically, with reference to FIG. 2A (cross-section view), the fabrication process can start with the structure 200 of FIG. 2A. The structure 200 is similar to the structure 100 of FIG. 1F. The formation of the structure 200 of FIG. 2A is similar to the formation of the structure 100 of FIG. 1F.

Next, with reference to FIG. 2B, in one embodiment, final via openings 265 and 266 are formed in the passivation layer 160 such that the top surface 155' of the bond pad 155 is exposed to the surrounding ambient through the final via openings 265 and 266. If the passivation layer 160 comprises polyimide, then the final via openings 265 and 266 can be formed by a conventional lithographic process.

FIG. 2Bi shows a top-down view of the structure 200 of FIG. 2B, in accordance with embodiments of the present invention. With reference to FIGS. 2B and 2Bi, it should be noted that FIG. 2B shows a cross-section view of the structure 200 of FIG. 2Bi along a line 2B-2B of FIG. 2Bi. The final via openings 265 and 266 can be referred to as the via hole 265 and the annular via trench 266. The via hole 265 is surrounded by the annular via trench 266. It should be noted that the final via openings 265 and 266 can be considered two separate final via openings.

Next, with reference to FIG. 2C, in one embodiment, final vias 282 and 284, BLM region 270, and a solder ball 285 are formed on the structure 200 of FIG. 2B. The steps for forming the final vias 282 and 284, the BLM region 270, and the solder ball 285 are similar to the steps for forming the final vias 182 and 184, the BLM region 170, and the solder ball 185 of FIG. 1N.

In the embodiments described above, with reference to FIG. 1N, there are only two separate final vias (i.e., the final vias 182 and 184) that electrically connect the solder ball 185 to the bond pad 155. In general, there can be N separate final vias (similar to the final vias 182 and 184) that electrically connect the solder ball 185 to the bond pad 155, wherein N is a positive integer. In order to form these N final vias, N separate final via openings can be formed in the passivation layer 160 of FIG. 1F. Each of the N separate final via openings can be either a via hole (similar to the via holes 162 and 164 of FIGS. 1G and 1Gi), a via trench (similar to the via trenches 162 an 164 of FIGS. 1G and 1Gii), or a single annular via trench (similar to the single annular via trench 162+164 of FIGS. 1G and 1Giii).

In the embodiments described above, with reference to FIG. 1J, each of the final via openings 162 and 164 entirely overlaps the bond pad 155 in the direction 115. Alternatively, each of the final via openings 162 and 164 just overlaps the bond pad 155 in the direction 115. A first region is said to overlap a second region in a reference direction if and only if there exits at least one point inside the first region such that a straight line going through that point and being parallel to the reference direction would intersect the second region.

In the embodiments described above, with reference to FIG. 1J, each of the final via openings 162 and 164 entirely overlaps the hole 186. Alternatively, each of the final via openings 162 and 164 either entirely overlaps or just overlaps the hole 186.

In the embodiments described above, with reference to FIGS. 1C and 1G, the terminal via hole 132 (FIG. 1C) may overlap either or both the final via openings 162 and 164 (FIG. 1G). Alternatively, it is preferred that the terminal via hole 132 (FIG. 1C) does not overlap any of the final via openings 162 and 164 (FIG. 1G).

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. A structure, comprising:
a first dielectric layer;
an electrically conductive bond pad on the first dielectric layer;
a second dielectric layer on top of the first dielectric layer and the electrically conductive bond pad, wherein the electrically conductive bond pad is sandwiched between the first and second dielectric layers, wherein the second dielectric layer comprises N separate final via openings such that a top surface of the electrically conductive bond pad is exposed to a surrounding ambient through each final via opening of the N separate final via openings, and wherein N is a positive integer greater than 1;
an electrically conductive line buried in the first dielectric layer;
a via buried in the first dielectric layer, wherein the electrically conductive bond pad is electrically connected to the via through the electrically conductive line;
a plurality of interconnect layers such that the first dielectric layer is sandwiched between the plurality of interconnect layers and the electrically conductive bond pad; and
an integrated circuit such that the plurality of interconnect layers are sandwiched between the integrated circuit and the first dielectric layer, wherein the electrically conductive line is electrically connected to the integrated circuit through the via and the plurality of interconnect layers.

2. The structure of claim 1, wherein the electrically conductive line and the via comprise copper.

3. The structure of claim 1, wherein the second dielectric layer comprises polyimide.

4. The structure of claim 1, wherein the electrically conductive bond pad comprises aluminum.

5. The structure of claim 1, wherein each final via opening of the N final via openings is independently selected from the group consisting of a via hole, a via trench, and a single annular via trench.

6. A structure, comprising:
a first dielectric layer;
an electrically conductive bond pad on the first dielectric layer;
a second dielectric layer on top of the first dielectric layer and the electrically conductive bond pad, wherein the electrically conductive bond pad is sandwiched between the first and second dielectric layers, wherein the second dielectric layer comprises N separate final via openings, and wherein N is a positive integer greater than 1;
N final vias, wherein the N final vias partially fill one-to-one the N final via openings;
a solder ball, wherein each final via of the N final vias is in direct physical contact with the solder ball, and wherein the solder ball is electrically connected to the electrically conductive bond pad through the N final vias;
an electrically conductive line buried in the first dielectric layer;
a via buried in the first dielectric layer, wherein the electrically conductive bond pad is electrically connected to the via through the electrically conductive line;
a plurality of interconnect layers such that the first dielectric layer is sandwiched between the plurality of interconnect layers and the electrically conductive bond pad; and
an integrated circuit such that the plurality of interconnect layers are sandwiched between the integrated circuit and the first dielectric layer, wherein the electrically conductive line is electrically connected to the integrated circuit through the via and the plurality of interconnect layers.

7. The structure of claim 6, further comprising a BLM (ball-limiting-metallurgy) region,
wherein the BLM region is sandwiched between and in direct physical contact with each final via of the N final vias and the electrically conductive bond pad.

8. The structure of claim 6, wherein the second dielectric layer comprises polyimide.

9. The structure of claim 6, wherein each final via opening of the N final via openings is independently selected from the group consisting of a via hole, a via trench, and a single annular via trench.

10. A structure formation method, comprising:
providing a structure which includes:
- a first dielectric layer,
- an electrically conductive bond pad on the first dielectric layer,
- a second dielectric layer on top of the first dielectric layer and the electrically conductive bond pad, wherein the electrically conductive bond pad is sandwiched between the first and second dielectric layers,
- an electrically conductive line buried in the first dielectric layer,
- a via buried in the first dielectric layer, wherein the electrically conductive bond pad is electrically connected to the via through the electrically conductive line
- a plurality of interconnect layers such that the first dielectric layer is sandwiched between the plurality of interconnect layers and the electrically conductive bond pad, and
- an integrated circuit such that the plurality of interconnect layers are sandwiched between the integrated circuit and the first dielectric layer, wherein the electrically conductive line is electrically connected to the integrated circuit through the via and the plurality of interconnect layers; and creating N final via openings in the second dielectric layer such that a top surface of the electrically conductive bond pad is exposed to a surrounding ambient through each final via opening of the N final via openings, wherein N is a positive integer greater than 1.

11. The method of claim 10, further comprising, after said creating N final via openings is performed, forming a BLM region, N final vias, and a solder ball on the second dielectric layer,
wherein BLM region is sandwiched between and in direct physical contact with each final via of the N final vias and the electrically conductive bond pad,
wherein the N final vias partially fill one-to-one the N final via openings,
wherein each final via of the N final vias is in direct physical contact with the solder ball, and
wherein the solder ball is electrically connected to the electrically conductive bond pad through the N final vias.

12. The method of claim 10, wherein each final via opening of the N final via openings is independently selected from the group consisting of a via hole, a via trench, and a single annular via trench.

13. The method of claim 10,
wherein a first final via opening of the N final via openings is a via hole,
wherein a second final via opening of the N final via openings is a single annular via trench, and
wherein the first final via opening is surrounded by the second final via opening.

14. The structure of claim 10, wherein the second dielectric layer comprises polyimide.

* * * * *